US011974506B2

(12) United States Patent
Wu et al.

(10) Patent No.: US 11,974,506 B2
(45) Date of Patent: Apr. 30, 2024

(54) SPIN-ORBIT TORQUE DEVICE

(71) Applicants: NATIONAL TAIWAN UNIVERSITY, Taipei (TW); Academia Sinica, Taipei (TW)

(72) Inventors: Po-Hsun Wu, Taipei (TW); Ssu-Yen Huang, Taipei (TW); Chia-Ling Chien, Cockeysville, MD (US); Danru Qu, Taipei (TW)

(73) Assignees: NATIONAL TAIWAN UNIVERSITY, Taipei (TW); ACADEMIA SINICA, Taipei (TW)

( * ) Notice: Subject to any disclaimer, the term of this patent is extended or adjusted under 35 U.S.C. 154(b) by 198 days.

(21) Appl. No.: 17/528,366

(22) Filed: Nov. 17, 2021

(65) Prior Publication Data
US 2022/0158084 A1    May 19, 2022

Related U.S. Application Data

(60) Provisional application No. 63/115,660, filed on Nov. 19, 2020.

(51) Int. Cl.
*H10N 52/00* (2023.01)
*H10N 50/85* (2023.01)

(52) U.S. Cl.
CPC ........... *H10N 52/101* (2023.02); *H10N 50/85* (2023.02)

(58) Field of Classification Search
CPC ...... H10N 52/101; H10N 50/85; H10N 50/00; H10N 50/10; H10N 50/20; H10N 52/85
See application file for complete search history.

(56) References Cited

PUBLICATIONS

Keller, Near-unity spin Hall ratio NixCu1-x alloys, American Physical Society, Jun. 2019, pp. 214411-1-214411-14.*

* cited by examiner

*Primary Examiner* — Latanya N Crawford Eason
(74) *Attorney, Agent, or Firm* — BACON & THOMAS, PLLC

(57) ABSTRACT

A spin-orbit torque device is disclosed, which includes: a magnetic layer; and a non-magnetic layer adjacent to the magnetic layer and comprising a spin-Hall material, wherein the spin-Hall material comprises $Ni_xCu_{1-x}$ alloy, and x is in a range from 0.4 to 0.8.

7 Claims, 8 Drawing Sheets

SPIN-ORBIT TORQUE DEVICE

CROSS REFERENCE TO RELATED APPLICATION

This application claims the benefit of filing date of U.S. Provisional Application Ser. No. 63/115,660, filed Nov. 19, 2020 under 35 USC § 119(e)(1).

BACKGROUND

1. Field

The present disclosure relates to a spin-orbit torque device. More specifically, the present disclosure relates to a spin-orbit torque device using a novel spin-Hall material.

2. Description of Related Art

Spintronics has evolved from exploiting spin polarized current phenomena (e.g., giant magnetoresistance (GMR) and spin transfer torque (STT)) in ferromagnetic materials to pure spin current phenomena (e.g., spin Hall effect (SHE) and spin orbit torque (SOT)) in materials with strong spin-orbit coupling (SOC). A pure spin current has the unique attribute of efficiently delivering spin angular momentum with a minimal of charge carriers in metals and no charge carriers in insulators. The main pure spin current materials thus far are 5d and 4d heavy metals with strong SOC (e.g., Pt, W, Ta) exhibiting high spin Hall angle $\theta_{SH}$ of order 0.1 as already explored in SOT switching of devices. While some 3d metals (e.g., Cu) have weak SOC and $\theta_{SH}\approx 0$, others (e.g., Ni and Cr) materials, including ferromagnetic (FM), and antiferromagnetic (AF) materials, exhibit large inverse spin Hall effect (ISHE) and substantial $\theta_{SH}$. Indeed, the 3d metals have provided new avenues and functionalities for pure spin current explorations, including spin-to-charge conversion, magnetization dependent spin Hall effect, and SOT magnetization switching. Unlike the 5d metals, which are usually non-magnetic, the 3d metals are often ferromagnetic (e.g., Fe, Ni, Co) or antiferromagnetic e.g., Mn, Cr), where there are both pure spin current effects and spin-polarized current effects, which must be delineated albeit challenging.

One of the most intriguing spin current phenomena in 3d materials is the discovery of enhanced spin-to-charge conversion and spin-current transmission in antiferromagnetic (AF) insulators near the Néel temperature ($T_N$). Pure spin current injected from a ferromagnetic insulator $Y_3Fe_5O_{12}$ (YIG) via a thermal gradient in spin Seebeck effect (SSE) and via microwave excitations in spin pumping (SP) can be greatly enhanced by inserting a thin AF insulator layer (e.g., NiO and CoO) between YIG and the spin current detector (e.g., Pt). The enhancement due to spin fluctuations has also been observed near $T_N$ of the AF metals (e.g., IrMn). However, for addressing the interplay of spin-polarized current and pure spin current, AF materials, insulating or conducting, are less desirable because these phenomena have been better established in FM materials.

The well-known 3d magnets of Fe, Co, Ni, and Py (permalloy=$Fe_{19}Ni_{81}$) have very high Curie ($T_C$) temperatures. With the accessible temperatures of only $T<T_C$, it is difficult to separate effects due to spin-polarized current and pure spin current in the FM state, let alone exploring the promising role of spin fluctuations near or above $T_C$. It is essential to select suitable 3d FM materials with tailored $T_C$, where effects due to spin-polarized current and pure spin current effects can be cleanly delineated, separated, and possibly even exploited.

SUMMARY

The present disclosure relates to a spin-orbit torque device, which comprises: a non-magnetic layer comprising a spin-Hall material, wherein the spin-Hall material comprises $Ni_xCu_{1-x}$ alloy, and x is in a range from 0.4 to 0.8 ($0.4\leq x\leq 0.8$).

In the conventional spin-orbit torque device, the 5d heavy metal elements, such as Pt, W and Ta are used as the spin-Hall material, resulting in the high manufacturing cost of the conventional spin-orbit torque device. In the spin-orbit torque device of the present disclosure, the $Ni_xCu_{1-x}$ alloy is used as the spin-Hall material. Compared to the 5d heavy metal elements, the $Ni_xCu_{1-x}$ alloy composed of 3d magnet is relatively cheap. Thus, the manufacturing cost of the spin-orbit torque device using the spin-Hall material of the $Ni_xCu_{1-x}$ alloy can be reduced.

In some embodiments, x in the $Ni_xCu_{1-x}$ alloy may be in a range from 0.4 to 0.8 ($0.4\leq x\leq 0.8$). In some embodiment, x may be in a range from 0.7 to 0.8 ($0.7\leq x\leq 0.8$). In some embodiments, x may be in a range from 0.75 to 0.8 ($0.75\leq x\leq 0.8$).

In some embodiments, the non-magnetic layer may have a thickness (t) ranging from 0.1 nm to 8 nm ($0.1$ nm$\leq t\leq 8$ nm). In some embodiments, the non-magnetic layer may have a thickness (t) ranging from 2 nm to 8 nm ($2$ nm$\leq t\leq 8$ nm). In some embodiments, the non-magnetic layer may have a thickness (t) ranging from 3 nm to 8 nm ($3$ nm$\leq t\leq 8$ nm).

In some embodiments, the spin-Hall material may be $Ni_{80}Cu_{20}$ alloy, and the non-magnetic layer may have a thickness ranging from 4.5 nm to 5.5 nm ($4.5$ nm$\leq t\leq 5.5$ nm). In this case, the Curie temperature of the $Ni_{80}Cu_{20}$ alloy can be about room temperature. However, the present disclosure is not limited thereto, and the Curie temperature of the $Ni_xCu_{1-x}$ alloy can be adjusted by modifying the Ni content and the thickness of the non-magnetic layer. For example, when x in the $Ni_xCu_{1-x}$ alloy is reduced, the thickness of the non-magnetic layer may be increased to maintain the Curie temperature of the $Ni_xCu_{1-x}$ alloy being about room temperature.

In some embodiments, the spin-Hall material (in particular, the $Ni_xCu_{1-x}$ alloy) may have the spin Hall angle ($\theta_{SH}$) of 42% to 50% ($42\%\leq\theta_{SH}\leq 50\%$) when the spin-Hall material (in particular, the $Ni_xCu_{1-x}$ alloy) is in the paramagnetic (PM) state; and the spin-Hall material (in particular, the $Ni_xCu_{1-x}$ alloy) may have the spin Hall angle of 8% to 15% ($8\%\leq\theta_{SH}\leq 15\%$) when the spin-Hall material (in particular, the $Ni_xCu_{1-x}$ alloy) is in the ferromagnetic (FM) state.

In some embodiments, the spin-Hall material (in particular, the $Ni_xCu_{1-x}$ alloy) may have the spin diffusion length ($\lambda_{sd}$) of 0.2 nm to 0.3 nm ($0.2$ nm$\leq\lambda_{sd}\leq 0.3$ nm) when the spin-Hall material (in particular, the $Ni_xCu_{1-x}$ alloy) is in the paramagnetic state; and the spin-Hall material (in particular, the $Ni_xCu_{1-x}$ alloy) may have the spin diffusion length of 0.4 nm to 0.5 nm ($0.4$ nm$\leq\lambda_{sd}\leq 0.5$ nm) when the spin-Hall material (in particular, the $Ni_xCu_{1-x}$ alloy) is in the ferromagnetic state.

In some embodiments, the spin-orbit torque device may further comprise a magnetic layer adjacent to the non-magnetic layer. The magnetic layer may comprise Fe, Ni, Co or alloy thereof, but the present disclosure is not limited thereto.

In some embodiments, the spin-orbit torque device may be a magnetic random access memory (MRAM), a magnetic logic device or racetrack memory. In some embodiments, the spin-orbit torque device is the MRAM.

The present disclosure further provides a method for detecting a magnetic ordering temperature of a material, comprising the following steps: providing a substrate with a layer of the material to be detected formed thereon; applying a temperature gradient to the material to be detected; and measuring voltages generated under the temperature gradient.

In some embodiments, the material to be detected may be formed on a Si substrate, the temperature gradient is applied to the material to be detected on the Si substrate, and the generated voltages are measured. The temperature where the voltage/temperature ($\Delta V/\Delta T$) vanishes abruptly can be determined as the Curie temperature of the material to be detected.

In some embodiments, the material to be detected may be formed on a YIG substrate, the temperature gradient is applied to the material to be detected on the YIG substrate, and the generated voltages are measured. The temperature where the voltage/temperature ($\Delta V/\Delta T$) is maximal can be determined as the Curie temperature of the material to be detected.

In some embodiments, the layer of the material to be detected may have a thickness (t) ranging from 0.1 nm to 8 nm (0.1 nm≤t≤8 nm). In some embodiments, the layer of the material to be detected may have a thickness (t) ranging from 2 nm to 8 nm (2 nm≤t≤8 nm). In some embodiments, the layer of the material to be detected may have a thickness (t) ranging from 3 nm to 8 nm (3 nm≤t≤8 nm).

It is know that superconducting quantum interference device (SQUID) with high sensitivity can be used to measure the small magnetization and the magnetic ordering temperature of the material to be detected, but the SQUID magnetometer is very expensive. The present disclosure provides a novel method to detect the magnetic ordering temperature of the material based on the anomalous Nernst effect (ANE) in the ferromagnetic metal of the material to be detected on the Si substrate or based on the ANE and inverse spin Hall effect (ISHE) in the ferromagnetic metal of the material to be detected on the YIG substrate. Thus, the magnetic ordering temperature of the material can be measured in a relatively cheap way compared to the conventional method using the SQUID magnetometer.

In the present disclosure, the Ni—Cu alloys with the same fcc structure are provided, where the magnetic ordering temperature $T_C$ can be tuned over a wide range of values by the Ni content. In addition, the present disclosure provides the interplay of inverse spin Hall effect (ISHE) of the pure spin current and the anomalous Nernst effect (ANE) of the spin-polarized current in Ni—Cu alloys. There are strong pure spin current effects in both the FM state and the PM state, with and without the spin-polarized current effects respectively. The present disclosure further provides that spin fluctuation can greatly enhance the spin-to-charge conversion with a spin Hall angle $\theta_{SH}$ even larger than those of Pt, Ta, and W. The present disclosure shows that ANE can function as a sensitive magnetometer to electrically detect magnetization and Curie temperature ($T_C$) of very thin FM films only a few nm in thickness.

Other novel features of the disclosure will become more apparent from the following detailed description when taken in conjunction with the accompanying drawings.

DETAILED DESCRIPTION OF EMBODIMENT

Figure 1A:
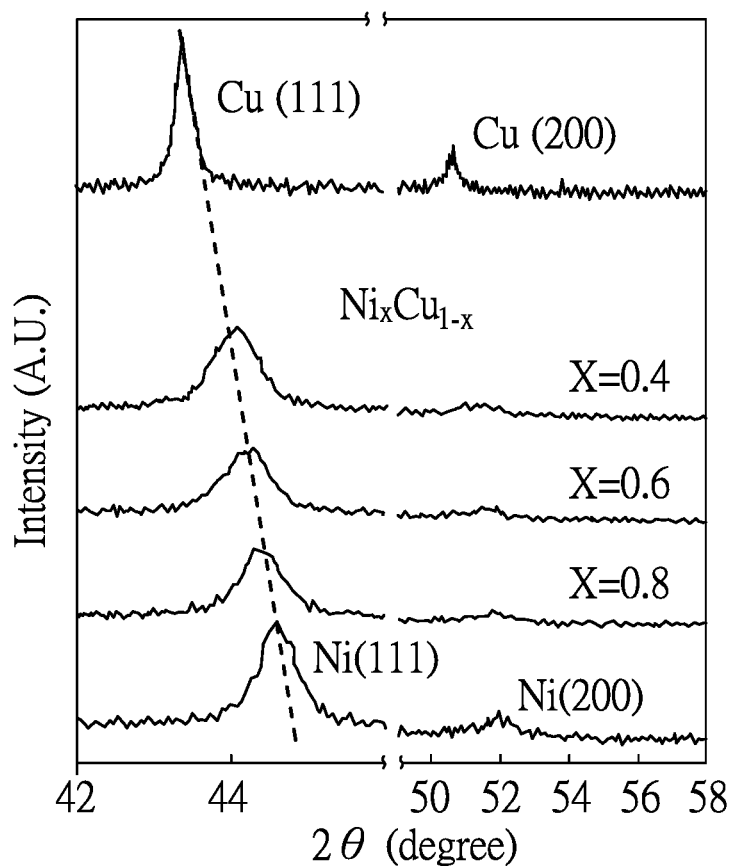
FIG. 1A is a diagram showing X-ray diffraction pattern of the 200-nm-thick $Ni_xCu_{1-x}$ (0<x<1.0) with different composition.

Different embodiments of the present disclosure are provided in the following description. These embodiments are meant to explain the technical content of the present disclosure, but not meant to limit the scope of the present disclosure. A feature described in an embodiment may be applied to other embodiments by suitable modification, substitution, combination, or separation.

It should be noted that, in the present specification, when a component is described to have an element, it means that the component may have one or more of the elements, and it does not mean that the component has only one of the element, except otherwise specified.

Moreover, in the present specification, when an element is described to be "suitable for" or "adapted to" another element, the other element is an example or a reference helpful in imagination of properties or applications of the element, and the other element is not to be considered to form a part of a claimed subject matter; similarly, except otherwise specified; similarly, in the present specification, when an element is described to be "suitable for" or "adapted to" a configuration or an action, the description is made to focus on properties or applications of the element, and it does not essentially mean that the configuration has been set or the action has been performed, except otherwise specified.

Moreover, in the present specification, a value may be interpreted to cover a range within ±10% of the value, and in particular, a range within ±5% of the value, except otherwise specified; a range may be interpreted to be composed of a plurality of subranges defined by a smaller endpoint, a smaller quartile, a median, a greater quartile, and a greater endpoint, except otherwise specified.

Experimental Method

The Si substrate and the YIG substrate were provided, and cleaned by acetone and then isopropyl alcohol about 30 minutes. Then, ethanol was used to remove the possible residual contamination (such as dust or particles) for about 10 minutes. Finally, DI-water was used to remove the residual organic solvent for about 10 minutes.

The $Ni_xCu_{1-x}$ thin films were deposited on the cleaned Si substrate and YIG substrate respectively. The $Ni_xCu_{1-x}$ thin films can be prepared by any method know in the art. Herein, the sputtering technique was used to prepare the $Ni_xCu_{1-x}$ thin films on the Si substrate and the YIG substrate. The sputtering system was operated under high vacuum environment with the order of $10^{-7}$~$10^{-8}$ torr, and the sputtering process was performed by using argon plasma. However, the present disclosure is not limited thereto. In another embodiment of the present disclosure, the magnetron sputtering may be used to improve the efficiency of sputtering, especially for magnetic materials.

By controlling the deposition rates or the sputtering target, the composition of the $Ni_xCu_{1-x}$ thin films can be adjusted. The X-ray reflectometry and atomic force microscope were used to measure film thickness and surface roughness, the X-ray diffraction (XRD) was used to measure crystal structures and film orientations, and the magnetometers was used to measure the magnetic properties of the $Ni_xCu_{1-x}$ thin films. For spin-dependent transport measurements, the $Ni_xCu_{1-x}$ films protected by a 2-nm Al film were patterned into Hall bar structure with widths of 200 μm by photolithography.

Results

Figure 1B:
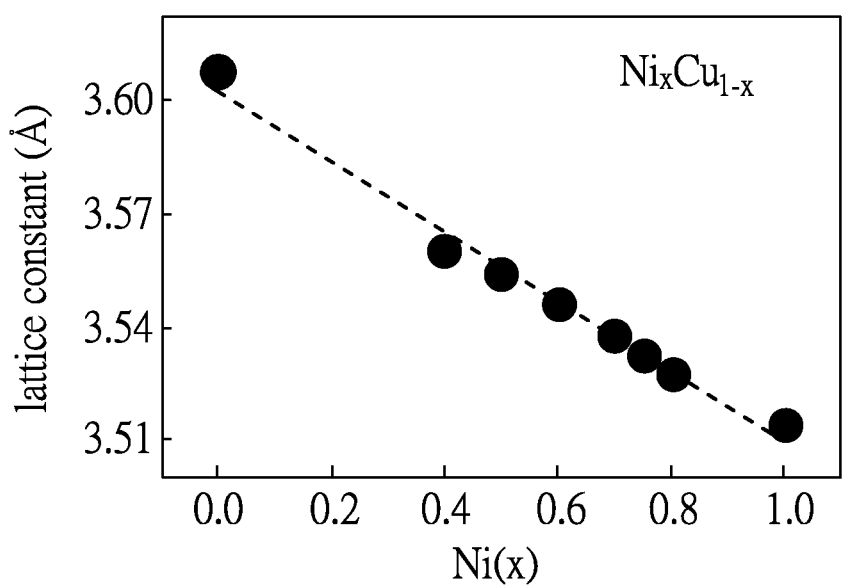
FIG. 1B is a diagram showing the composition dependence of lattice constant a for $Ni_xCu_{1-x}$.

The X-ray diffraction (XRD) patterns of the 200-nm-thick $Ni_xCu_{1-x}$ alloys show they all are mainly fcc (111)-textured as shown in FIG. 1A. With increasing Ni content, the (111) peak progressively shifts to higher diffraction angles because the lattice constant of 0.351 nm of Ni is smaller than that of 0.361 nm of Cu. The fcc lattice parameter (a) depends linearly on the Ni content, a manifestation of the Vegard's law, as shown in FIG. 1B.

There are various ways to inject spin-polarized current and pure spin current via electrical (e.g., anomalous Hall, spin Hall), thermal (anomalous Nernst, spin Seebeck), and FMR excitations (e.g., spin pumping). Spin pumping and electrical injection may inadvertently include other contributions especially thermal due to the high current density and FMR heating. Longitudinal thermal injection in the out-of-plane direction via anomalous Nernst effect (ANE) and spin Seebeck effect (SSE) are the simplest injection schemes with little parasitic effects.

Figure 1C:
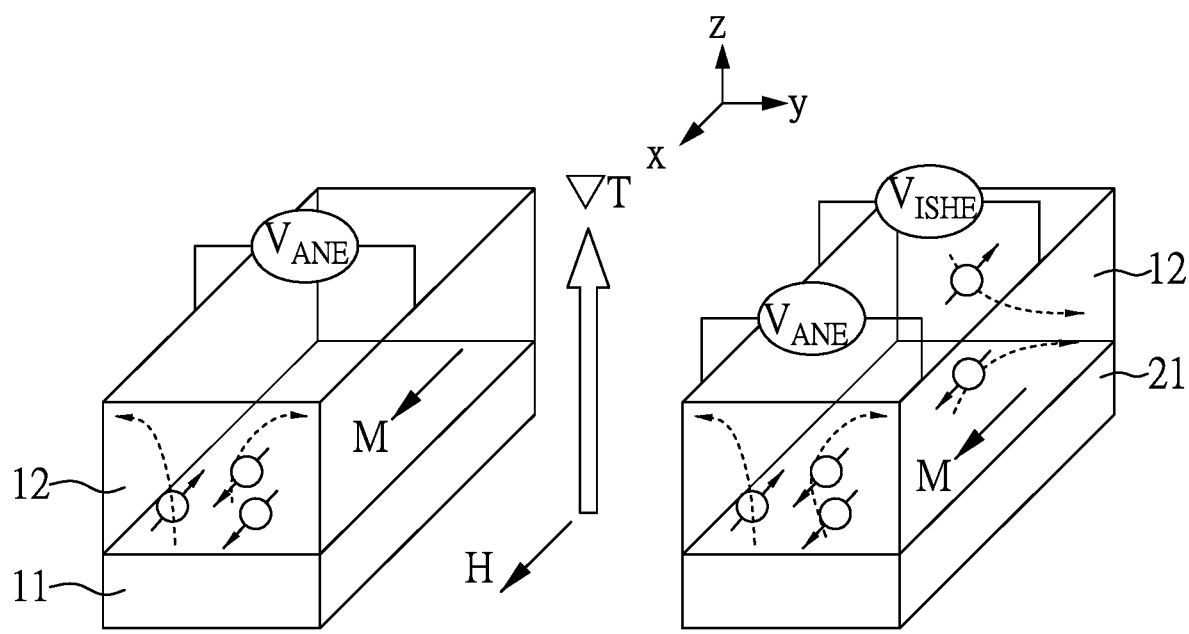
FIG. 1C is a schematic view of anomalous Nernst effect (ANE) in a ferromagnetic metal (FM) and inverse spin Hall effect (ISHE) and ANE in FM/YIG under a temperature gradient.

FIG. 1C is a schematic view of anomalous Nernst effect (ANE) in a ferromagnetic metal (FM) and inverse spin Hall effect (ISHE) and ANE in FM/YIG under a temperature gradient.

The left device shown in FIG. 1C is the device for measuring the voltages under a temperature gradient, wherein the FM film 12 (for example, the $Ni_xCu_{1-x}$ film) is formed on the Si substrate 11, and a voltage meter (not shown in the figure) is electrically connected to the pads (not shown in the figure) on the FM film 12. In addition, a heater (not shown in the figure) is also provided in this device to provide temperature gradient to the FM film 12. By using the left device shown in FIG. 1C, the ANE voltage ($V_{ANE}$) in the FM film 12 can be measured.

The right device shown in FIG. 1C is similar to the left device, except that the Si substrate 11 shown in the left device is replaced by the YIG substrate 21 shown in the right device. By using the right device shown in FIG. 1C, the ANE voltage ($V_{ANE}$) plus ISHE voltage ($V_{ISHE}$) in the FM film 12 can be measured by a voltage meter (not shown in the figure). It should be noted that, in the right device shown in FIG. 1C, the ANE voltage and the ISHE voltage are shown separately, but the ANE voltage and the ISHE voltage may be measured together by one voltage meter.

As shown in FIG. 1C, for a FM with in-plane magnetization along the x direction, a temperature gradient ($\nabla T$) in the out-of-plane (z) direction injects a charge current in the z-direction. The spin-orbit coupling (SOC) in the FM causes unequal amount of spin-up and spin-down electrons to deflect laterally in opposite directions, resulting in a spin-polarized current due to the ANE electric field in the y-direction of the following Eq. (1):

$$E_{ANE} = Q_S 4\pi M \times \nabla T, \qquad (1)$$

and detected as an ANE voltage in the y-direction.

In the longitudinal spin Seebeck effect (SSE) scheme, one places a thin metal film on ferromagnetic YIG also in a vertical temperature gradient, which injects a pure spin current $j_S$ in the z-direction with spin index in the x-direction into the metal, in which the SOC causes both spin-up and spin-down electrons to deflect laterally to the same side in the y-direction via the ISHE electric field proportional to $\sigma \times \nabla T$ or $\sigma \times j d_S$, detected as an ISHE voltage. In the case of a FM metal, with magnetization in the x-direction aligned by an external field, the electrical fields due to ANE and ISHE are both in the y-directions, thus their voltages are additive.

Figure 2A:
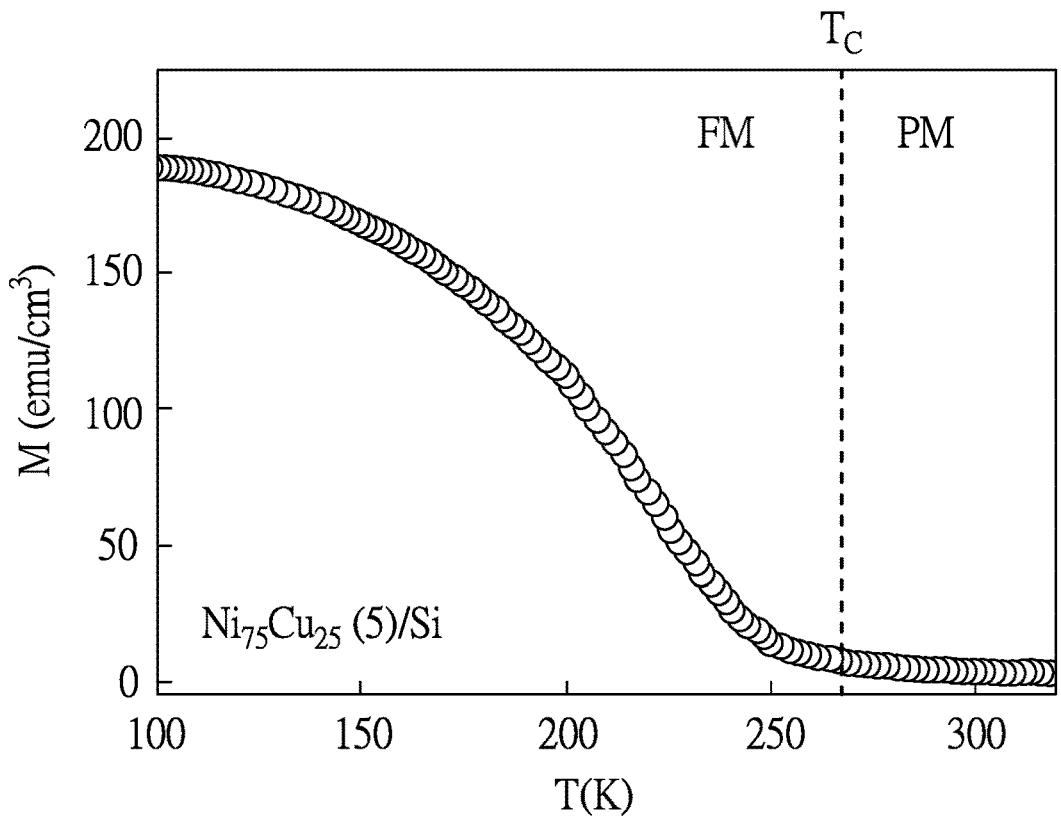
FIG. 2A is a diagram showing Temperature-dependent magnetization of $Ni_{75}Cu_{25}$ (5 nm)/Si measured by the SQUID magnetometer.
Figure 2B:
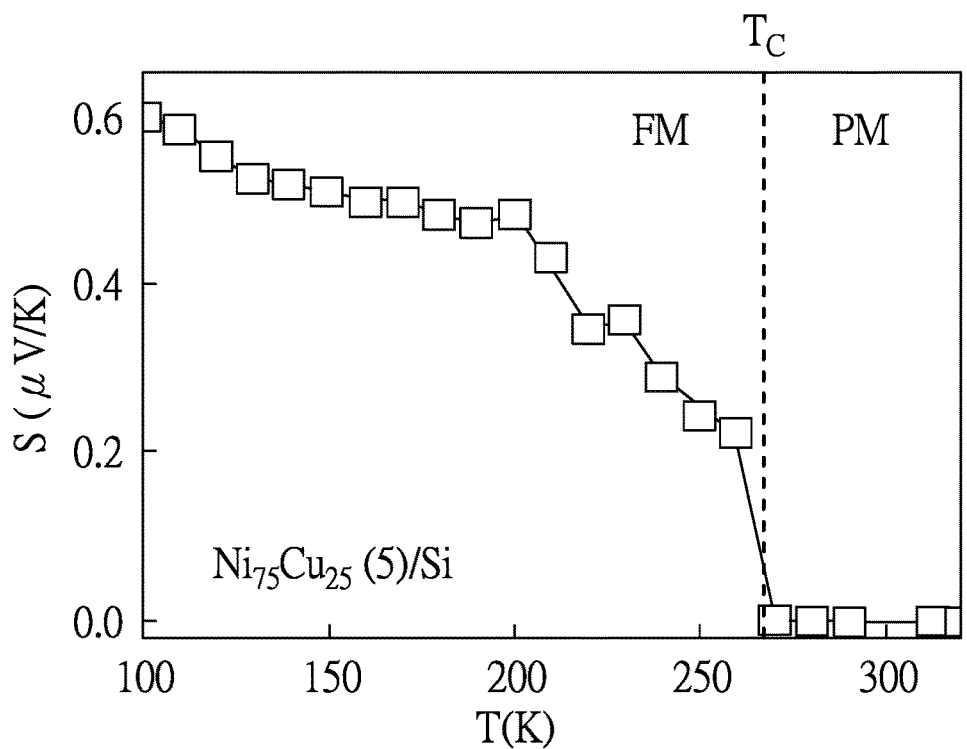
FIG. 2B is a diagram showing Temperature-dependence of ANE of $Ni_{75}Cu_{25}$ (5 nm)/Si.
Figure 2C:
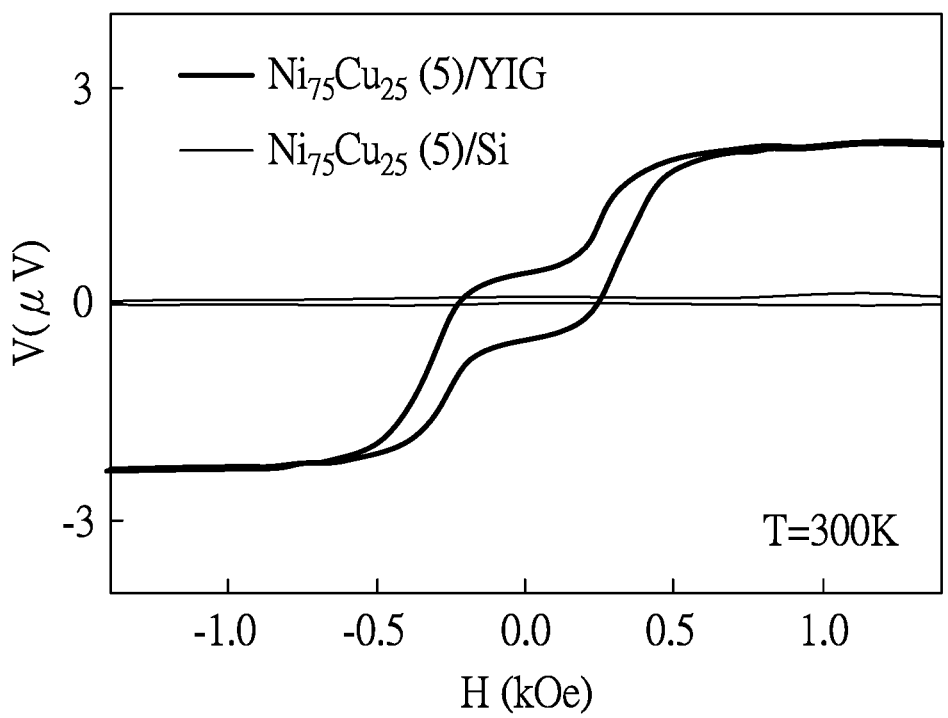
FIG. 2C is a diagram showing the spin dependent thermal voltage as a function of magnetic field (H) measured in $Ni_{75}Cu_{25}$ (5 nm)/Si and $Ni_{75}Cu_{25}$ (5 nm)/YIG at 300 K above its $T_c$.
Figure 2D:
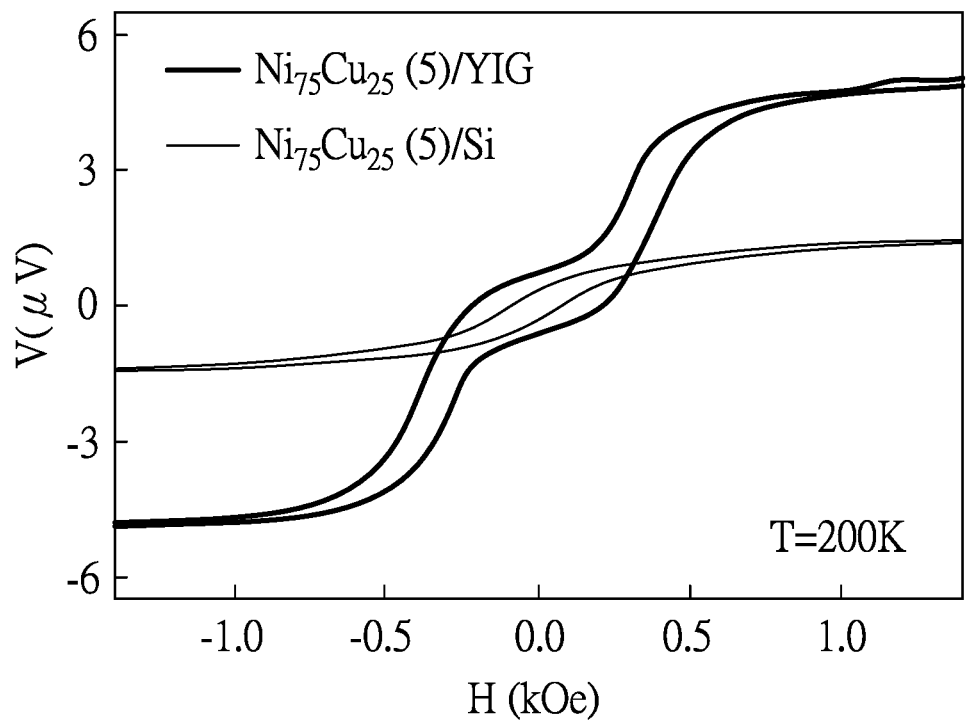
FIG. 2D is a diagram showing the spin dependent thermal voltage as a function of magnetic field (H) measured in $Ni_{75}Cu_{25}$ (5 nm)/Si and $Ni_{75}Cu_{25}$ (5 nm)/YIG at 200 K below its $T_c$.

The SQUID magnetometer with high sensitivity is used to measure the small magnetization ($\sim 10^{-5}$ emu) and the magnetic ordering temperature of thin $Ni_xCu_{1-x}$ alloys, typically 5 nm thick. An example of $Ni_{75}Cu_{25}$ (5)/Si (number in parentheses is the thickness in nanometer) for revealing Curie temperature ($T_c$) of 260K is shown in FIG. 2A. From Eq. (1) shown above, under a constant $|\nabla T|$, the ANE voltage is proportional to the magnetization M. Thus, ANE can electrically measure M. As shown in FIG. 2C and FIG. 2D, the ANE voltage in $Ni_{75}Cu_{25}$ (5)/Si while sizable at 200 K, vanishes at 300 K. The ANE voltage in fact vanishes abruptly at $T_c$ of 260K, as shown in FIG. 2B. The ANE readily measures the hysteresis loop and $T_c$ in thin FM films only a few nm thick, can function as a sensitive magnetometer for measuring FM with in-plane magnetization, in a manner similar to that of anomalous Hall effect (AHE) as a sensitive magnetometer for measuring FM with perpendicular magnetization.

When $Ni_{75}Cu_{25}$ (5)/YIG is subjected to a similar out-of-plane temperature gradient of 20 K/mm, in addition to the ANE within $Ni_{75}Cu_{25}$ (5), there is also pure spin current injection from YIG via the SSE with the resultant ISHE voltage. As shown in FIG. 2C and FIG. 2D, voltage in $Ni_{75}Cu_{25}$ (5)/YIG at 200 K and also at 300 K even after $Ni_{75}Cu_{25}$ (5) has become paramagnetic at T>260 K, where there is no spin-polarized current and only pure spin current. The lateral voltages measured due to ANE and ISHE shown in FIG. 2C and FIG. 2D saturates at large ±H fields. The value of $\Delta V$ is defined by these voltages. In $Ni_{75}Cu_{25}$ (5)/Si, one observes only $\Delta V=\Delta V_{ANE}$ of about 2.6 µV at 200 K and 0 µV at 300 K. However, in $Ni_{75}Cu_{25}$ (5)/YIG under similar temperature gradient, one observes $\Delta V=\Delta V_{ISHE}=5$ µV at 300 K when $Ni_{75}Cu_{25}$ (5) is paramagnetic with $\Delta V_{ANE}=0$ V. Importantly, one observes an even larger $\Delta V=\Delta V_{ISHE}+\Delta V_{ANE}=9.5$ µV at 200 K that contains both the ANE and the ISHE contributions, where $\Delta V_{ANE}$ can be measured in $Ni_{75}Cu_{25}$ (5)/Si. These results provide clear evidences that ferromagnetic alloys exhibit substantial spin-to-charge conversion in the ferromagnetic state as well as in the paramagnetic state. In FIG. 2C and FIG. 2D, the presence of a plateau behavior in the low field region in the ISHE voltage is due to the effect of demagnetizing factor from surface magnetization of YIG The ANE loop at 200 K as shown in FIG. 2D reveals the coercivity of $Ni_{75}Cu_{25}$ (5).

Figure 3A:
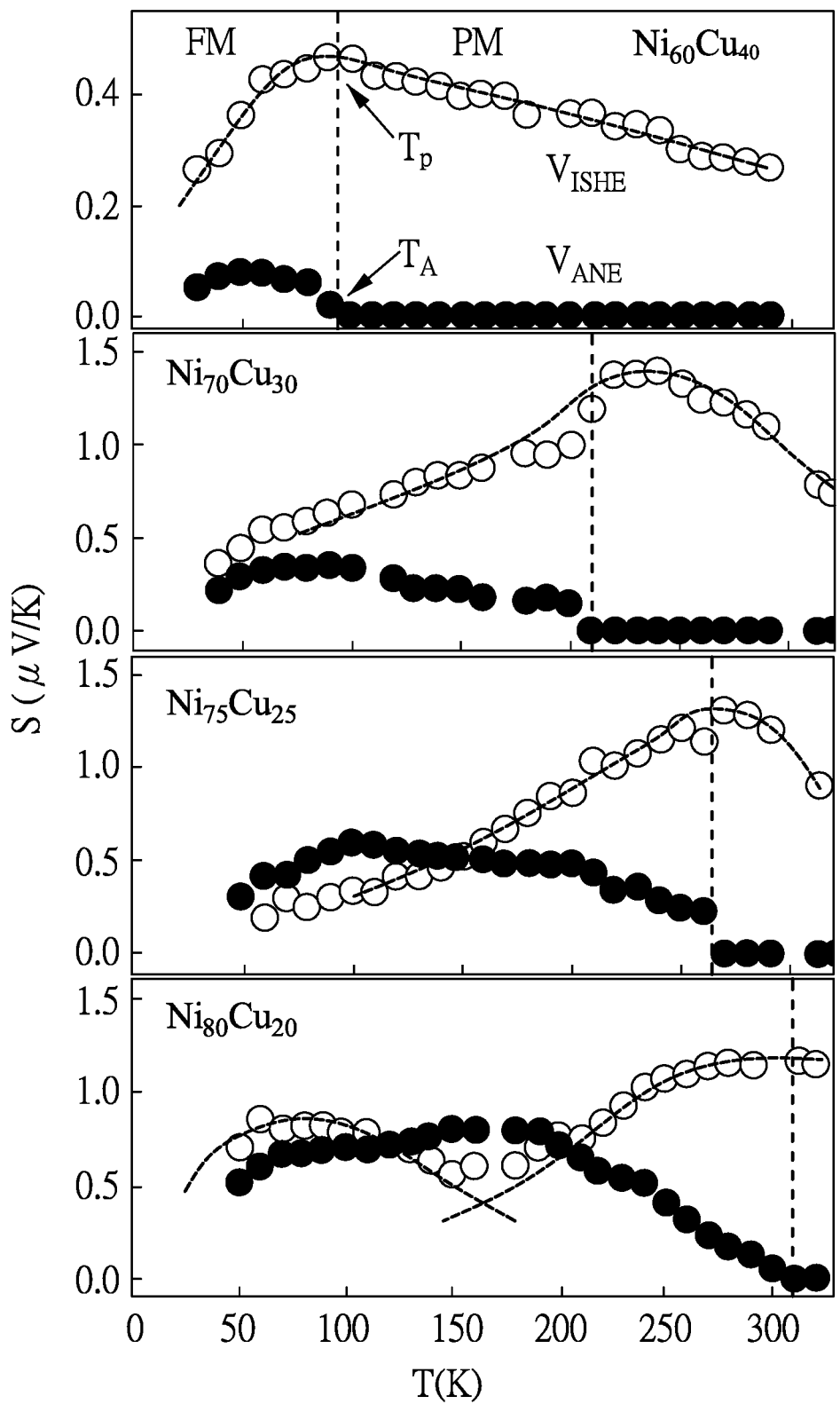
FIG. 3A is a diagram showing temperature-dependent ANE (solid circles) and ISHE (hollow circles) voltage for $Ni_xCu_{1-x}$ with x being 0.5, 0.6, 0.7, 0.75, and 0.8.

The present example also displays results in S(µV/K)=$\Delta V/\Delta T$, where $\Delta T$ is temperature difference. FIG. 3A shows S(µV/K) of $\Delta V_{ANE}$ and $\Delta V_{ISHE}$, the latter with $\Delta V_{ANE}$ subtracted from $\Delta V$, as a function of temperature across the phase transition of $Ni_xCu_{1-x}$ with a range of compositions (0.4≤x≤0.8). The S(µV/K) of $Ni_xCu_{1-x}$/Si (solid circles), consisting of only ANE, reveals a sharp phase transition at $T_A$, which is just $T_C$, above which $Ni_xCu_{1-x}$ is in the paramagnetic state with no ANE. On the other hand, S(µV/K) of $Ni_xCu_{1-x}$/YIG (hollow circles), containing ANE and the pure spin current contribution, is always substantial below and even above $T_C$.

Figure 3B:
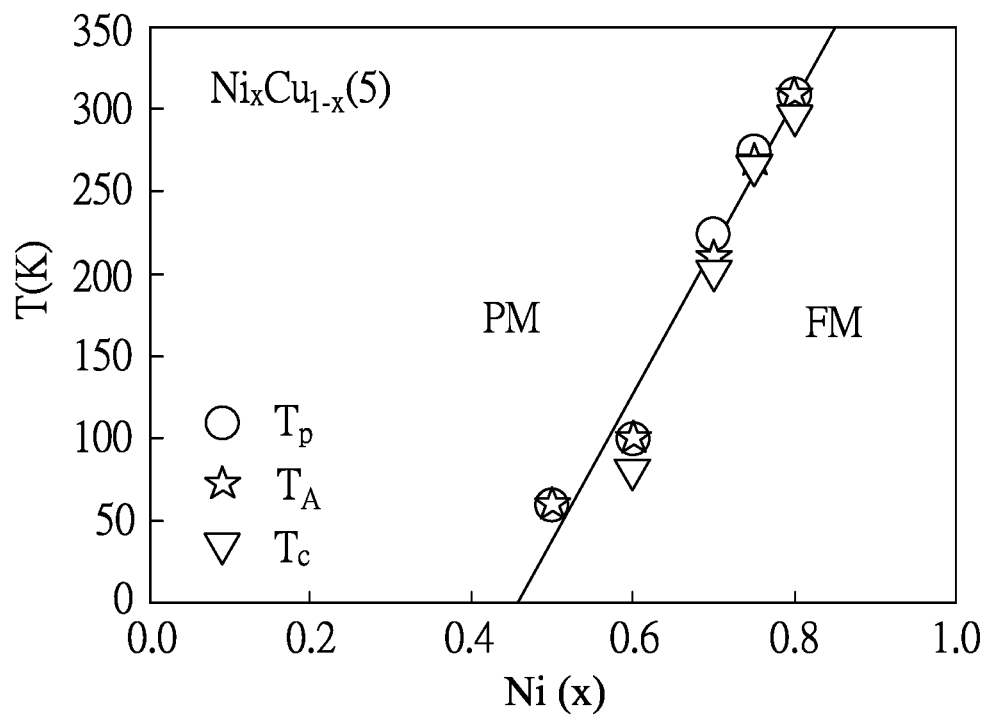
FIG. 3B is a diagram showing values of $T_P$, $T_A$, and $T_c$ as a function of $Ni_xCu_{1-x}$ compositions.
Figure 3C:
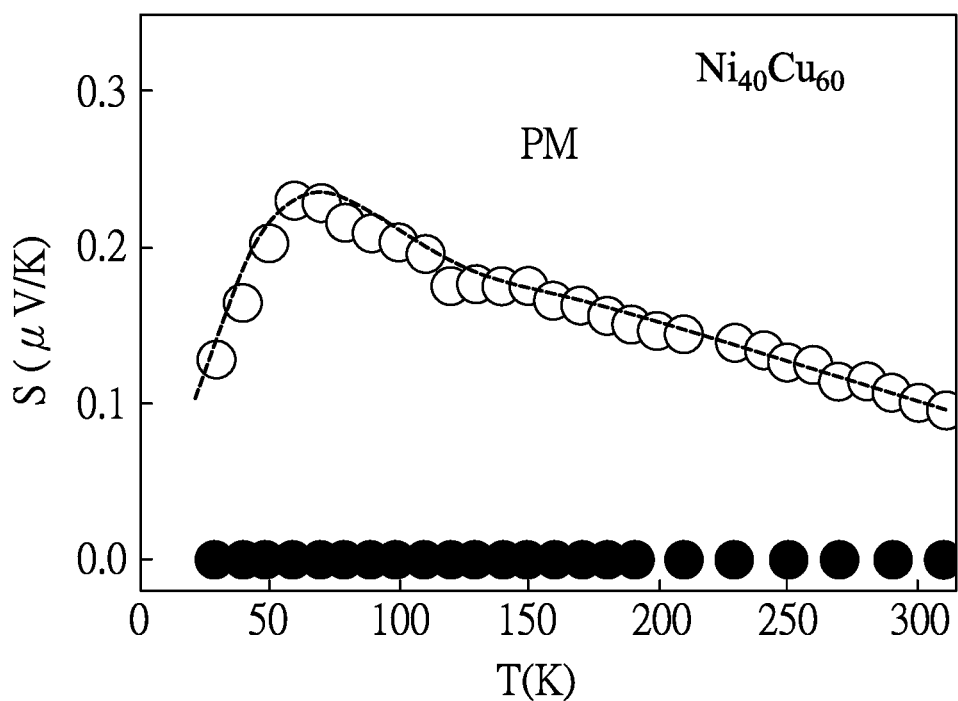
FIG. 3C is a diagram showing temperature-dependent ANE (solid circles) and ISHE (hollow circles) voltage of $Ni_{40}Cu_{60}$.

Also prominently displayed is the pure spin current enhancement due to spin fluctuations, most intensely near $T_C$, at which S(µV/K) is maximal. These results show clearly that spin fluctuations in Ni—Cu alloys can greatly enhance the already substantial spin-to-charge conversion. Above $T_C$, spin fluctuation decreases with increasing temperature, so are its effect on pure spin current enhancement. The magnetic ordering temperature of Ni—Cu alloys are shown in FIG. 3B, where the values of $T_C$ determined by SQUID magnetometry, $T_A$ where ANE in Ni—Cu/Si vanishes, and $T_P$ where S(µV/K) in Ni—Cu/YIG is maximal, are in very good agreement. All three methods can be used to determine the ordering temperatures of FM materials. But the ANE method enjoys the clear advantages of higher sensitivity especially beneficial for thin films. In Ni—Cu alloys, the ordering temperature decreases linearly with reducing Ni content, and becomes non-magnetic at about x=0.45. However, as shown in FIG. 3C while there is no magnetic ordering and no ANE in $Ni_{40}Cu_{60}$/Si down to about 20 K, there is substantial S(µV/K) at all temperatures in $Ni_{40}Cu_{60}$/YIG, increasing in values for decreasing temperature reflecting the incipient magnetic ordering and the presence of spin fluctuation. At a low temperature of about 60 K, S(µV/K) decreases sharply towards zero as it should when T=0 K approaches. Noted, the competition between the propagation length of magnon and the concentration of magnon in YIG can lead to nonmonotonic temperature-dependent behavior similar to the enhancement of the spin current (e.g., Pt/YIG). However, two contributions can be clearly distinguished in $Ni_{80}Cu_{20}$, since spin current enhancement occurs at around room temperature, but the contribution of the magnon population from YIG remains at low temperatures.

Figure 4A:
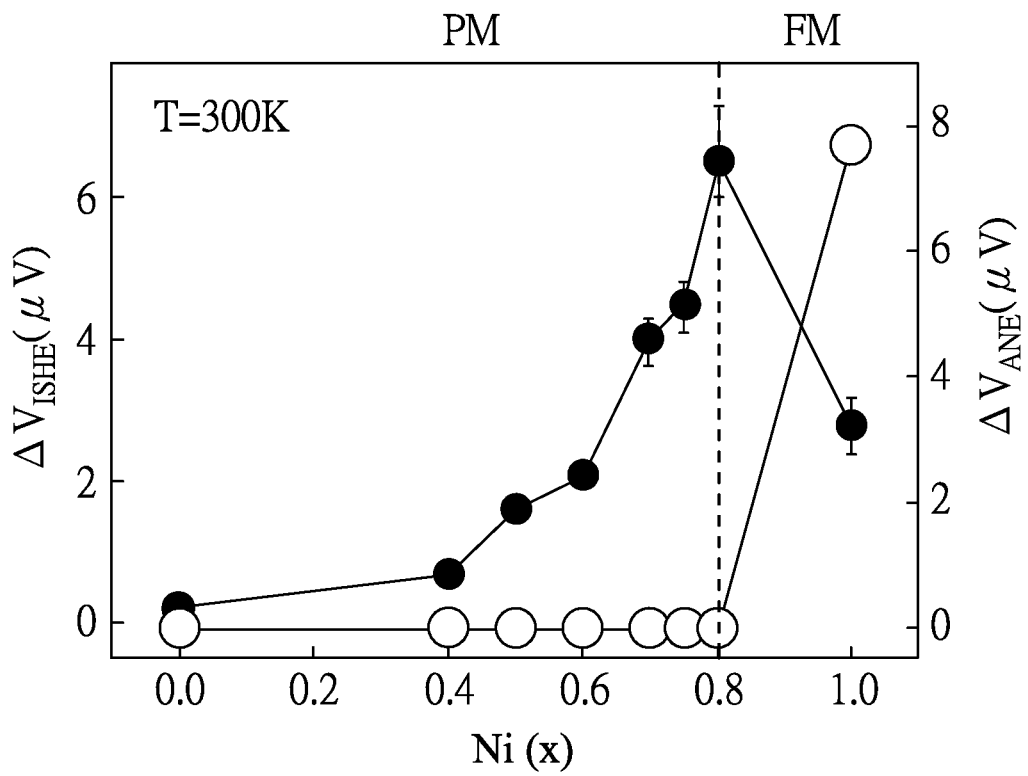
FIG. 4A is a diagram showing composition-dependence of $\Delta V_{ANE}$(hollow circles) for $Ni_xCu_{1-x}$ (5 nm)/Si and that of $\Delta V_{ISHE}$ (solid circles) for $Ni_xCu_{1-x}$ (5 nm)/YIG with 0<x<1.0 at room temperature.

Furthermore, the interplay of the pure spin current and the spin-polarized current can also be apparent at room temperature when one compare the spin-dependent thermal voltages of ANE and ISHE for 5-nm $Ni_xCu_{1-x}$ in a wide range of compositions (0≤x≤1.0) measured. As shown in FIG. 4A, the $\Delta V_{ISHE}$ (solid circles) measured at 300 K increases with the Ni content until $Ni_{80}Cu_{20}$, beyond which $\Delta V_{ISHE}$ decreases with the simultaneous appearance of $\Delta V_{ANE}$ (hollow circles), where 5-nm $Ni_xCu_{1-x}$ with x>0.8 is ferromagnetic. Therefore, in the specific case of $Ni_{80}Cu_{20}$, the spin current can be substantially enhanced at room temperature through spin fluctuation near the phase transition. Thus, one can exploit spin fluctuations to greatly enhance pure spin current in $Ni_{80}Cu_{20}$ for room temperature operations.

To quantitatively determine the enhanced spin-to-charge efficiency of $Ni_{80}Cu_{20}$ at room temperature, SSE measurements in $Ni_{80}Cu_{20}$ of a series of thicknesses were performed to evaluate spin Hall angle $\theta_{SH}$ and spin diffusion length $\lambda_{sd}$. The ISHE voltage depends on the thickness t as the following Eq. (2):

$$\Delta V_{ISHE}(t) = 2CL\nabla T\rho(t)\theta_{SH}\frac{\lambda_{sd}}{t}\tanh\left(\frac{t}{2\lambda_{sd}}\right) \quad (2)$$

where L=6 mm is the distance between the voltage terminals, $\Delta T$=26 K/mm is the temperature gradient, and C is the spin current injection coefficient. The resistivity (t) is also determined through experiments. From the linear interpolation with C(Ni)=1.55 $Am^{-1}K^{-1}$ for Ni and C(Cu)=1.24 $Am^{-1}K^{-1}$ for Cu, C($Ni_{80}Cu_{20}$)=1.5 $Am^{-1}K^{-1}$ for $Ni_{80}Cu_{20}$ can be obtained.

Figure 4B:
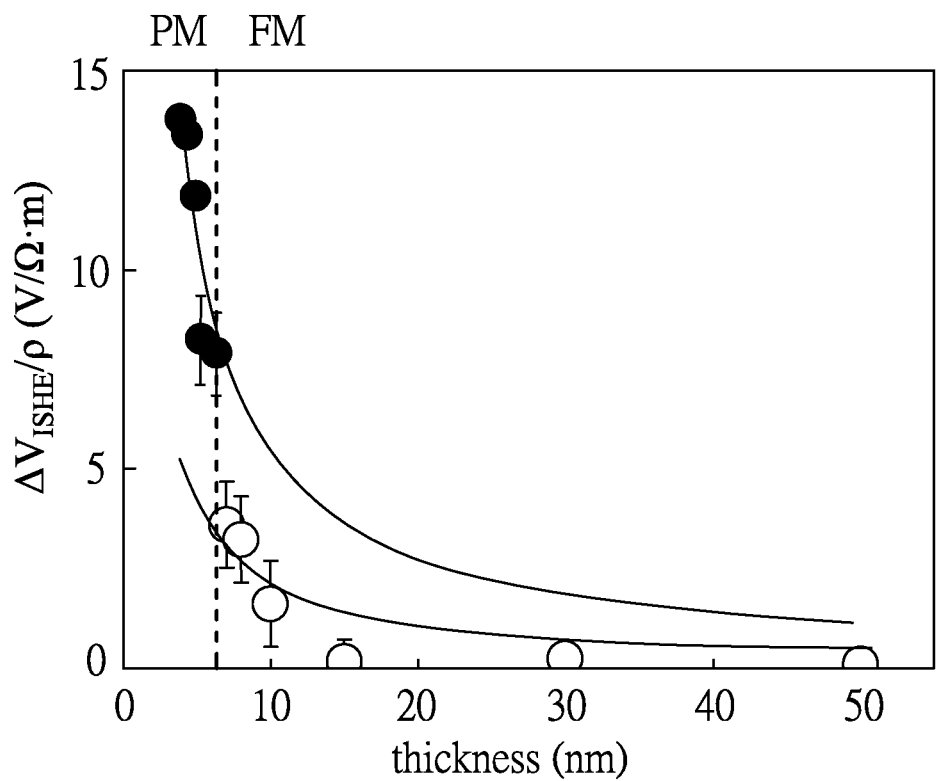
FIG. 4B is a diagram showing thickness-dependence of $\Delta V_{ISHE}/\rho$ for $Ni_{80}Cu_{20}$, wherein the solid circles and the hollow circles are the fitted results using Eq. (2) (described hereinafter) for $Ni_{80}Cu_{20}$ in PM and FM.

For non-magnetic metals (e.g., Pt), $\Delta V_{ISHE}(t)/\rho(t)$ decreases with increasing t in a quasi-hyperbolic manner. However, the results of $\Delta V_{ISHE}(t)/\rho(t)$ shown in FIG. 4B for $Ni_{80}Cu_{20}$ exhibits a clear break at t=7 nm because its ordering temperature is close to 300 K. Samples of $Ni_{80}Cu_{20}$ with t greater and less than 7 nm has $T_C$ above and below 300 K respectively, hence a discontinuity at 7 nm in FIG. 4B. From the fitting in FIG. 4B (solid lines) by Eq. (2), when $Ni_{80}Cu_{20}$ is in the FM state, $\theta_{SH}$=110 and $\lambda_{sd}$=0.42 nm can be obtained, which are comparable to those of heavy metals. On the other hand, when $Ni_{80}Cu_{20}$ is in the PM state, a large enhancement to value of $\theta_{SH}$=460 and $\lambda_{sd}$=0.22 nm can be obtained. Under the definition using number of carriers of $\theta_{SH}$≤1, $\theta_{SH}$=46% is the largest reported to date.

Figure 4C:
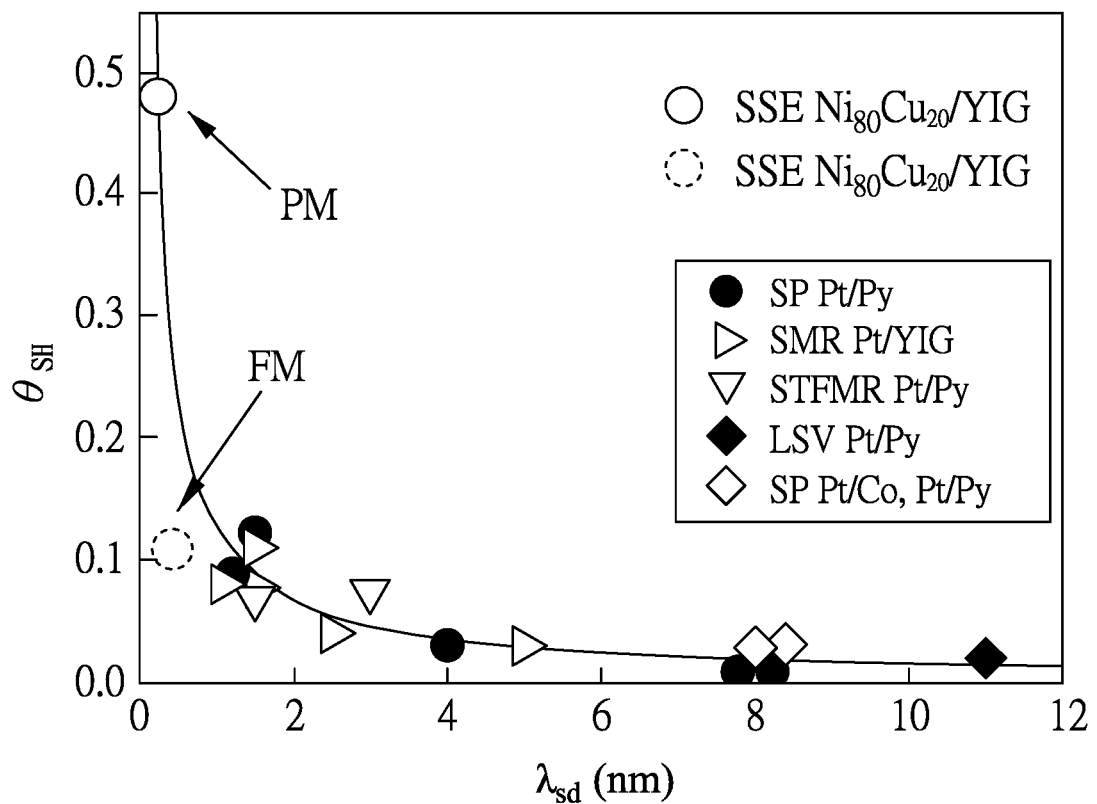
FIG. 4C is a plot of $\theta_{SH}$ vs $\lambda_{sd}$ at room temperature, wherein the hollow circles are the result for $Ni_{80}Cu_{20}$ in the PM and FM states, other solid symbols are results for Pt in literature, and the curve represents $\theta_{SH}* \lambda_{sd}$=0.13 nm.

Although the $\theta_{SH}$ value of metals may vary greatly (e.g., Pt), depending on the experimental technique or the analyses, empirically the relation of $\theta_{SH}\lambda_{sd}$≈constant has been suggested as shown in FIG. 4C containing the results of various reports. Our results of $\theta_{SH}$=110 and $\lambda_{sd}$=0.42 nm in the FM state, and $\theta_{SH}$=46% and $\lambda_{sd}$=0.22 nm in the PM state of $Ni_{80}Cu_{20}$ appear to be also consistent with this correlation of $\theta_{SH}\lambda_{sd}$~0.13 nm denoted as the line. The enhanced spin-to-charge conversion and the larger $\theta_{SH}$ in $Ni_{80}Cu_{20}$ to short-range spin fluctuation leads to the shorter $\lambda_{sd}$. Ni—Cu alloys in general, and $Ni_{80}Cu_{20}$ in particular, not only exhibit much larger spin-to-charge efficiency than those of Pt, they are about three orders of magnitude less costly than Pt.

In summary, the present disclosure show the strong interplay of the anomalous Nernst effect of the spin-polarized current, the inverse spin Hall effect of the pure spin current, and spin fluctuation in magnetic alloys that has been revealed in $Ni_xCu_{1-x}$ in a wide range of compositions ($0 \leq x \leq 1.0$) with tailored magnetic ordering temperature. We demonstrate the strong interaction of pure spin current and spin fluctuation can greatly enhance spin-to-charge conversion, yielding remarkably high spin Hall angle of 46% in $Ni_{80}Cu_{20}$ at room temperature, that can be exploited in various spin-based applications and devices. We also show that the spin-dependent thermal transport via the ANE can serve as a sensitive magnetometer to electrically detect magnetic phase transitions.

Figure 5:
FIG. 5 is a cross-sectional view showing a spin-orbit torque device according to one embodiment of the present disclosure.

FIG. 5 is a cross-sectional view showing a spin-orbit torque device according to one embodiment of the present disclosure.

The spin-orbit torque device of the present embodiment comprises: a non-magnetic layer 42 comprising a spin-Hall material; and a magnetic layer 41 adjacent to the non-magnetic layer 42. Herein, the spin-Hall material may be the $Ni_xCu_{1-x}$ alloy described above. The magnetic layer 41 may comprise a ferromagnetic material, and the ferromagnetic material may comprise Fe, Ni, Co or alloy thereof; but the present disclosure is not limited thereto. In addition, the spin-orbit torque device of the present embodiment may be used as a magnetic random access memory.

When the non-magnetic layer 42 is a $Ni_{80}Cu_{20}$ layer having a thickness of about 5 nm, the spin-orbit torque device can be operated at room temperature. However, the present disclosure is not limited thereto. In another embodiment of the present disclosure, x in the $Ni_xCu_{1-x}$ alloy and the thickness of the non-magnetic layer 42 can be adjusted to achieve the spin-orbit torque device capable of operating at room temperature or at other temperature under or above the room temperature, according to the need.

Although the present disclosure has been explained in relation to its embodiment, it is to be understood that many other possible modifications and variations can be made without departing from the spirit and scope of the disclosure as hereinafter claimed.

What is claimed is:

1. A spin-orbit torque device, comprising:
a non-magnetic layer comprising a spin-Hall material, wherein the spin-Hall material is $Ni_{80}Cu_{20}$ alloy, the non-magnetic layer has a thickness ranging from 4.5 nm to 5.5 nm, and a Curie temperature of the $Ni_{80}Cu_{20}$ alloy is about room temperature.

2. The spin-orbit torque device of claim 1, wherein the spin-Hall material has the spin Hall angle of 42% to 50% when the spin-Hall material is in the paramagnetic state.

3. The spin-orbit torque device of claim 1, wherein the spin-Hall material has the spin Hall angle of 8% to 15% when the spin-Hall material is in the ferromagnetic state.

4. The spin-orbit torque device of claim 1, wherein the spin-Hall material has the spin diffusion length of 0.2 nm to 0.3 nm when the spin-Hall material is in the paramagnetic state.

5. The spin-orbit torque device of claim 1, wherein the spin-Hall material has the spin diffusion length of 0.4 nm to 0.5 nm when the spin-Hall material is in the ferromagnetic state.

6. The spin-orbit torque device of claim 1, further comprising a magnetic layer adjacent to the non-magnetic layer.

7. The spin-orbit torque device of claim 1, which is a magnetic random access memory.

* * * * *